United States Patent [19]

Takeuchi et al.

[11] Patent Number: 5,281,888

[45] Date of Patent: Jan. 25, 1994

[54] PIEZOELECTRIC/ELECTROSTRICTIVE ELEMENT HAVING AUXILIARY ELECTRODE DISPOSED BETWEEN PIEZOELECTRIC/ELECTROSTRICTIVE LAYER AND SUBSTRATE

[75] Inventors: Yukihisa Takeuchi, Aichi; Koji Kimura, Nagoya, both of Japan

[73] Assignee: NGK Insulators, Ltd., Japan

[21] Appl. No.: 30,535

[22] Filed: Mar. 12, 1993

[30] Foreign Application Priority Data

Mar. 17, 1992 [JP] Japan .................. 4-091849

[51] Int. Cl.⁵ ........................................... H01L 41/08
[52] U.S. Cl. .................................. 310/366; 310/363; 310/365; 310/358
[58] Field of Search ................ 310/363, 310/366; 310/357, 310/359, 330/332, 324, 328

[56] References Cited

U.S. PATENT DOCUMENTS

| | | |
|---|---|---|
| 3,509,387 | 4/1970 | Thorn et al. . |
| 4,456,850 | 6/1984 | Inoue et al. . |
| 4,564,851 | 1/1986 | Nilsson et al. . |
| 4,638,206 | 1/1987 | Tsunooka et al. . |
| 4,642,508 | 2/1987 | Suzuki et al. ................ 310/324 X |
| 4,680,595 | 7/1987 | Cruz-Uribe et al. . |
| 4,769,570 | 9/1988 | Yokoyama et al. ............... 310/332 |
| 4,783,821 | 11/1988 | Muller et al. . |
| 4,906,840 | 3/1990 | Zdeblick et al. . |
| 5,126,615 | 6/1992 | Takeuchi et al. .................. 310/330 |
| 5,191,559 | 3/1993 | Kahn et al. .................... 310/334 X |
| 5,210,455 | 5/1993 | Takeuchi et al. .................. 310/328 |

FOREIGN PATENT DOCUMENTS

| | | |
|---|---|---|
| 2570223 | 3/1986 | France . |
| 0137318 | 8/1983 | Japan ................... 310/324 |
| 58-196069 | 11/1983 | Japan . |
| 59-32182 | 2/1984 | Japan . |
| 0072277 | 4/1985 | Japan ................... 310/324 |
| 61-253873 | 11/1986 | Japan . |
| 62-213399 | 9/1987 | Japan . |
| 63-285983 | 11/1988 | Japan . |
| 1-282878 | 11/1989 | Japan . |
| 2161647 | 1/1986 | United Kingdom . |

*Primary Examiner*—Mark O. Budd
*Attorney, Agent, or Firm*—Parkhurst, Wendel & Rossi

[57] ABSTRACT

A piezoelectric/electrostrictive element is disclosed which includes a ceramic substrate formed principally of partially or fully stabilized zirconia, a lower electrode formed on the ceramic substrate, a piezoelectric/electrostrictive layer formed on the lower electrode, and an upper electrode formed on the piezoelectric/electrostrictive layer. The element further includes an auxiliary electrode formed on the ceramic substrate, apart from the lower electrode, such that a portion of the auxiliary electrode is located between the piezoelectric/electrostrictive layer and the ceramic substrate. The auxiliary electrode is formed of an electrically conductive material which permits sufficiently good adhesion of the auxiliary electrode to the ceramic substrate and the piezoelectric/electrostrictive layer. The upper electrode extends between and is electrically connected to the piezoelectric/electrostrictive layer and the auxiliary electrode.

10 Claims, 4 Drawing Sheets

PIEZOELECTRIC/ELECTROSTRICTIVE ELEMENT HAVING AUXILIARY ELECTRODE DISPOSED BETWEEN PIEZOELECTRIC/ELECTROSTRICTIVE LAYER AND SUBSTRATE

BACKGROUND OF THE INVENTION

1. Field of the Invention

The present invention relates to a uni-morph, bi-morph or other types of piezoelectric or electrostrictive elements which undergo displacement in the form of bending, deflection or flexure and which can be used for ink jet print heads, microphones, sounding bodies (such as loudspeakers), various resonators or vibrators, sensors, and other components or devices. The term "element" used herein is interpreted to mean an element capable of transducing or converting an electric energy into a mechanical energy, e.g., mechanical force, displacement, strain or vibrations, or transducing such a mechanical energy into an electric energy.

2. Discussion of the Related Art

In the recent years, in the fields of optics and precision positioning or machining operations, for example, there have been widely used and increasingly demanded an element whose displacement can be controlled for adjusting or controlling an optical path length or the position of a member or component of a device, on the order of fractions of a micron ($\mu$m), and a detecting element adapted to detect infinitesimal displacement of a subject as an electric change. To meet this need, there have been developed various piezoelectric or electrostrictive elements utilizing the reverse or converse piezoelectric effect or electrostrictive effect in which a piezoelectric or electrostrictive material produces a mechanical displacement upon application of a voltage or electric field thereto, or the piezoelectric effect in which the piezoelectric material produces a voltage or electric field upon application of pressure or mechanical stress. Recently, there are increasing requirements for further improved capability and operating reliability of the piezoelectric/electrostrictive elements.

The piezoelectric or electrostrictive element of the uni-morph or bi-morph type is carried by a substrate in the form of a plate, which functions as an oscillator or transducer plate. For assuring sufficient amount and force of bending or flexural displacement of the substrate or plate, it is important to reduce the thickness of the substrate, on the one hand.

On the other hand, however, the reduction in the substrate thickness undesirably results in a decrease in the mechanical strength of the substrate. In addition, the piezoelectric or electrostrictive element of the conventional uni-morph or bi-morph type is unsatisfactory in its operating reliability since the element consists of mutually superposed plate-like members including a piezoelectric/electrostrictive plate, which members are bonded to each other by means of adhesives, for example.

In view of the above problems, the inventors of the present invention developed a piezoelectric/electrostrictive element as disclosed in co-pending U.S. patent application Ser. No. 07/912,920, which includes a ceramic substrate formed principally of zirconia whose crystal phase is partially or fully stabilized. On this ceramic substrate are formed in lamination a lower electrode, a piezoelectric/electrostrictive layer and an upper electrode, by a suitable film-forming technique. The piezoelectric/electrostrictive layer is formed of a piezoelectric/electrostrictive material having a composite perovskite structure which contains lead element.

The piezoelectric/electrostrictive element as described just above can be formed with a significantly reduced thickness as compared with the conventional counterpart, and is therefore able to produce a relatively large amount of displacement by application of a relatively low voltage thereto, with a sufficiently large magnitude of force or electric potential generated, assuring an improved operating response. Further, the use of the ceramic substrate formed principally of partially or fully stabilized zirconia leads to a significantly increased mechanical strength of the element.

In the piezoelectric/electrostrictive element of the above type, it is desirable that electrical lead portions of the lower and upper electrodes are both formed on the ceramic substrate, so as to facilitate electrical connection of the electrodes with an outside electric circuit. One considered example, such a desirable piezoelectric/electrostrictive element is constructed such that an upper electrode 6 is formed on a piezoelectric/electrostrictive layer 4 formed on a ceramic substrate 2, with an electrical lead portion of the electrode 6 formed on the substrate 2, as shown in FIG. 6, wherein reference numeral 8 denotes a lower electrode whose lead portion is also formed on the substrate 2.

However, it is difficult for this type of element to assure a sufficiently great bonding strength between the piezoelectric/electrostrictive layer 4 and the ceramic substrate 2, since desired piezoelectric/electrostrictive characteristics of the layer 4 can be maintained by restraining or reducing the chemical reaction between the layer 4 and the substrate 2. Also, the piezoelectric/electrostrictive layer 4 should not be bonded or joined to the ceramic substrate 2 in terms of the mechanism of displacement or deformation of the element.

If the upper electrode 6 is formed to extend between the piezoelectric/electrostrictive layer 4 and ceramic substrate 2 which are not joined together, the upper electrode 6 tends to be disconnected at the interface between the ceramic substrate 2 and the layer 4, due to heat, mechanical shock, vibrations and the like which may occur during manufacture or use of the element. This makes it difficult for the element to assure sufficiently high operating reliability.

To deal with the above problem, it is proposed to provide a coating layer made of resin, for example, at the interface between the substrate 2 and the piezoelectric/electrostrictive layer 4. However, this method was found unsatisfactory to solve the above problem.

SUMMARY OF THE INVENTION

It is therefore an object of the present invention to provide a piezoelectric/electrostrictive element wherein an upper electrode is formed with sufficiently high strength and reliability, so as to extend between a piezoelectric/electrostrictive layer and a substrate, without deteriorating the characteristics of the piezoelectric/electrostrictive layer.

The above object may be accomplished according to the principle of the present invention, which provides a piezoelectric/electrostrictive element comprising: a ceramic substrate formed principally of zirconia having a crystal phase which is partially or fully stabilized; a lower electrode formed on the ceramic substrate; a piezoelectric/electrostrictive layer formed on the lower electrode, the piezoelectric/electrostrictive layer being formed of a piezoelectric/electrostrictive material having a perovskite structure or a composite perovskite structure which contains lead element; an upper electrode formed on the piezoelectric/electrostrictive layer, the lower electrode and the piezoelectric/electrostrictive layer cooperating with the upper electrode to form a laminar structure; and an auxiliary electrode formed on the ceramic substrate, apart from the lower electrode, such that a portion of the auxiliary electrode is located between the piezoelectric/electrostrictive layer and the ceramic substrate, the auxiliary electrode being formed of an electrically conductive material which permits sufficient adhesion of the auxiliary electrode to the ceramic substrate and the piezoelectric/electrostrictive layer, the upper electrode extending between and electrically connected to the auxiliary electrode and the piezoelectric/electrostrictive layer.

In the piezoelectric/electrostrictive element constructed as described above according to the present invention, the auxiliary electrode is partially interposed between the piezoelectric/electrostrictive layer and the ceramic substrate, assuring a significantly increased bonding strength between the layer and substrate. Since the upper electrode is formed to extend between the auxiliary electrode and the piezoelectric/electrostrictive layer, a force exerted on the upper electrode at the interface between the layer and auxiliary electrode can be reduced to a minimum.

Consequently, the piezoelectric/electrostrictive element of the invention permits a lead portion for electrical connection of the upper electrode, as well as a lead portion for the lower electrode, to be formed on the ceramic substrate, without suffering from disconnection of the upper electrode and other problems.

Preferably, the piezoelectric/electrostrictive material of the piezoelectric/electrostrictive layer contains lead magnesium niobate, lead zirconate and lead titanate as major components.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1A:
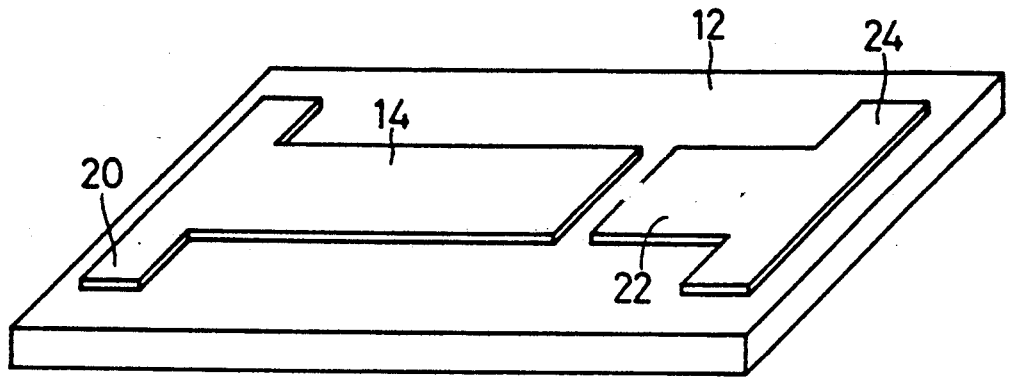
FIGS. 1A-1C are perspective views showing one embodiment of a piezoelectric/electrostrictive element of the present invention, FIG. 1A showing one process step of producing the element in which a lower electrode and an auxiliary electrode are formed on a ceramic substrate, FIG. 1B showing another step in which a piezoelectric/electrostrictive layer is formed, and FIG. 1C showing a further step in which an upper electrode is formed.
Figure 1B:
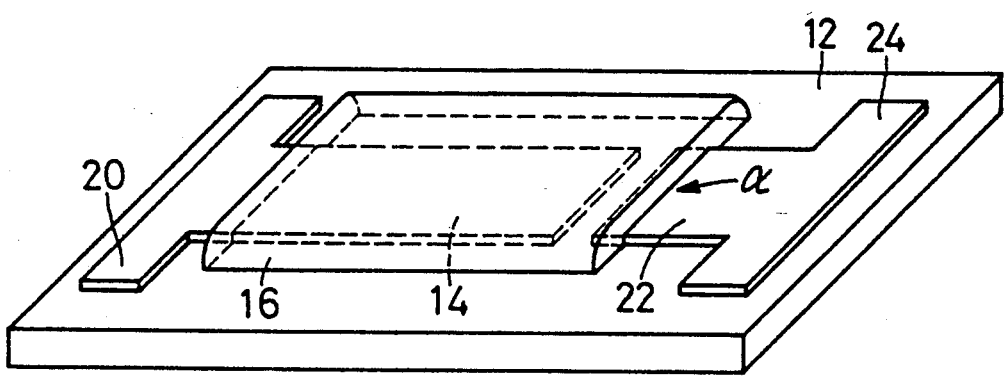
Figure 1C:
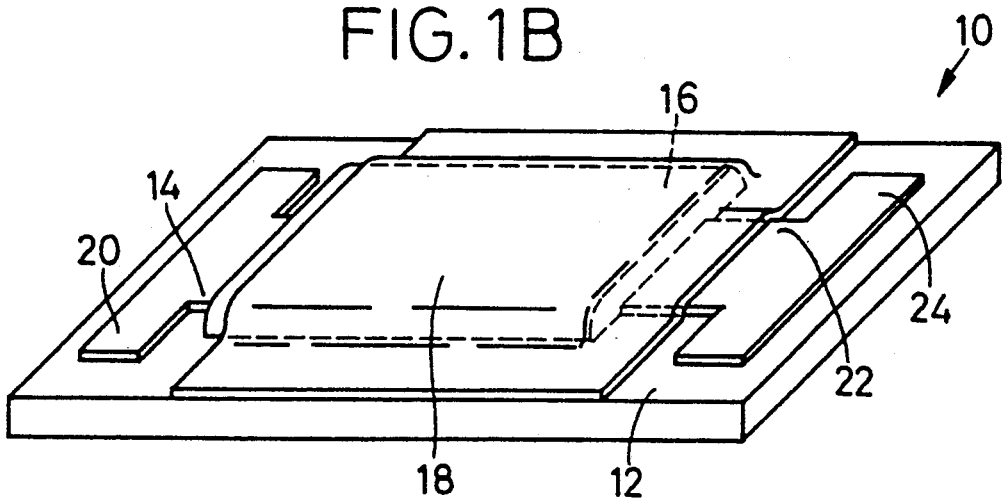

Referring first to FIG. 1C, there is shown a piezoelectric/electrostrictive element or actuator 10 as one embodiment of the present invention, which includes a ceramic substrate 12 in the form of a thin flat plate. The actuator 10 further includes a lower electrode 14, a film-like piezoelectric/electrostrictive layer 16 and an upper electrode 18, which are successively formed in lamination on one of opposite major surfaces of the substrate 12, by an ordinary film-forming method, to provide a multi-layer integral structure.

More specifically, the ceramic substrate 12 is formed of a material whose major component is zirconia having a crystal phase that is partially or fully stabilized by at least one compound as specified below. The term "partially or fully stabilized zirconia" used herein should be interpreted to mean zirconia whose crystal phase is partially or fully stabilized, respectively, so that the crystal phase partially undergoes or does not undergo phase transformations upon application of heat, stress or the like thereto.

Namely, the ceramic substrate 12 formed principally of the thus partially or fully stabilized zirconia is restrained or prevented from chemically reacting with the piezoelectric/electrostrictive layer 16 formed thereon, whereby the characteristics of the layer 16 may not deteriorate due to such chemical reaction.

The above-indicated compound or compounds for fully or partially stabilizing the zirconia is selected from the group consisting of: yttrium oxide; ytterbium oxide; cerium oxide; calcium oxide; and magnesium oxide. The zirconia is partially or fully stabilized as desired, by addition of at least one of these compounds, that is, one selected of the above-indicated oxides or a selected combination of two or more of these oxides. It is desirable to stabilize the zirconia by adding 1-30 mole %, preferably 1.5-6 mole %, of yttrium oxide or ytterbium oxide, or 6-50 mole %, preferably 8-20 mole %, of cerium oxide, or 5-40 mole %, preferably 5-20 mole %, of calcium oxide or magnesium oxide. It is particularly recommended to use yttrium oxide in an amount of 1.5-6 mole %, more preferably 2-4 mole %. With the crystal phase of the zirconia partially stabilized by addition of the yttrium oxide in the above-indicated range, the resultant ceramic substrate 12 exhibits particularly excellent properties.

The substrate material which contains the thus stabilized zirconia as a major component may further contain as additives aluminum oxide or titanium oxide, and/or a sintering aid such as clay. It is desirable to adjust the composition and amount of the sintering aid so that the fired substrate does not contain silicon oxide (SiO or $SiO_2$) in an amount of 1% or larger by weight. The ceramic substrate 12 containing an excessive amount of silicon oxide is likely to react with a piezoelectric/electrostrictive material (which will be described) of the piezoelectric/electrostrictive layer 16 during heat-treatment, making it difficult to control the composition of the material.

To assure a high-speed operating response and a sufficiently large amount of displacement of the actuator 10, the thickness of the ceramic substrate 12 is generally controlled to be not larger than 50 μm, preferably not larger than 30 μm, and more preferably not larger than 10 μm. For achieving a sufficiently high strength of the ceramic substrate 12, the average crystal grain size of the substrate 12 is preferably held within a range of 0.05–2 μm, more preferably not larger than 1 μm.

The ceramic substrate 12 may be fired before the lower electrode 14 and the piezoelectric/electrostrictive layer 16 are formed on the substrate 12. Alternatively, the the lower electrode 14 and piezoelectric/electrostrictive layer 16 are formed on a green sheet for the substrate 12, and then co-fired with the green sheet. However, it is desirable to form the electrode 14 and layer 16 on the fired ceramic substrate 12, to thereby reduce the amount of warpage of the actuator produced and achieve a sufficiently high dimensional and patterning accuracy of the electrode 14 and layer 16.

The lower electrode 14 formed on the above-indicated one major surface of the ceramic substrate 12 is a strip-like film having a suitable width, which extends from one longitudinal end of the substrate 12 toward the other end, over a length which is slightly short of the whole length of the piezoelectric/electrostrictive layer 16 to be formed on the substrate 12 in the next step. This lower electrode 14 is formed at its one longitudinal end with a lead portion 20 as an integral part thereof.

On the same major surface of the ceramic substrate 12, there is also formed an auxiliary electrode 22 in the form of a film having a suitable width, which extends from the other longitudinal end of the substrate 12 toward the lower electrode 14. The length of the auxiliary electrode 22 is determined such that the distal end of the auxiliary electrode 22 (remote from the other longitudinal end of the substrate 12) is spaced a suitable distance apart from the corresponding end of the lower electrode 14, and such that the distal end portion of the auxiliary electrode 22 is covered with the piezoelectric/electrostrictive layer 16 to be formed in the next step. This auxiliary electrode 22 is formed at its proximal end (remote from the lower electrode 14) with a lead portion 24 as an integral part thereof.

The lower electrode 14 and the auxiliary electrode 22 may be formed of different materials or the same material, which is/are selected from electrically conductive materials that permit good adhesion or sufficiently high strength of bonding of the electrodes 14, 22 to both the ceramic substrate 12 and the piezoelectric/electrostrictive layer 16. More specifically, the electrodes 14, 22 are preferably formed of a material whose major component is a noble metal having a high melting point, such as platinum, palladium or rhodium, or an alloy such as silver-palladium alloy, silver-platinum alloy or platinum-palladium alloy. It is more preferable to use platinum only, or a cermet of platinum and the material for the ceramic substrate 12 and/or the material for the piezoelectric/electrostrictive layer 16, so as to achieve improved adhesion of the electrodes 14, 22 to the substrate 12 or layer 16, and reduce the thermal stresses produced upon firing of the electrodes 14, 22. Further, it is undesirable to use glass as an additive for the electrodes 14, 22, since the glass is likely to react with the piezoelectric/electrostrictive layer 16 during heat-treatment of the electrode, resulting in deterioration of the operating characteristics of the actuator obtained.

When the cermet of platinum and the ceramic substrate material or piezoelectric/electrostrictive material is used as a material for the lower electrode 14 and auxiliary electrode 22, the content of the substrate material or piezoelectric material is preferably held within a range of about 5–30% by volume. The cermet material for the lower electrode 14 and auxiliary electrode 22 needs to be selected so that the electrodes 14, 22 do not substantially react with the material of the piezoelectric/electrostrictive layer 16 so as not to significantly deteriorate the characteristics of the layer 16.

The lower electrode 14 and auxiliary electrode 22 made of the above-indicated material may be formed on the ceramic substrate 12, by a selected one of various known film-forming methods which include: thin-film forming techniques such as ion-beam method, sputtering, vacuum vapor deposition, ion plating, CVD and plating; and thick-film forming techniques such as screen printing, spraying, dipping and coating. Of these film-forming methods, screen printing or other thick-film forming technique is particularly preferably employed.

While the thickness of the thus formed electrodes 14, 22 is suitably determined depending upon the application or utility of the actuator, the electrodes 14, 22 are generally formed in thickness of not larger than 20 μm, preferably not larger than 5 μm.

The lower electrode 14 and auxiliary electrode 22 formed on the ceramic substrate 12 is then heat-treated to be thereby integrated with the substrate 12. However, such heat-treatment is not necessarily practiced when the electrodes 14, 22 are formed by the above-indicated film-forming methods.

The piezoelectric/electrostrictive layer 16 is formed to spread over the thus formed lower electrode 14 and auxiliary electrode 22. This layer 16 may be formed of any piezoelectric or electrostrictive material which produces a relatively large amount of strain or displacement due to the converse or reverse piezoelectric effect or electrostrictive effect. The piezoelectric or electrostrictive material may be a semi-conductor material or a dielectric or ferroelectric ceramic material. Further, the piezoelectric or electrostrictive material may either require a treatment for initial polarization or poling, or may not require such a polarization treatment.

The piezoelectric/electrostrictive material of the layer 16 has a composition whose major component may be lead zirconate titanate (PZT), lead magnesium niobate (PMN), lead nickel niobate (PNN), lead manganese niobate, lead antimony stannate, lead zinc niobate, lead titanate, or a mixture or solid solution thereof. Further, a material (such as PLZT) containing an oxide or compound of lanthanum (La), barium (Ba), niobium (Nb), zinc (Zn), cerium (Ce), cadmium (Cd), chromium (Cr), cobalt (Co), antimony (Sb), iron (Fe), yttrium (Y), tantalum (Ta), tungsten (W), nickel (Ni), manganese (Mn), lithium (Li), strontium (Sr), calcium (Ca) and/or bismuth (Bi) may be added to the piezoelectric or electrostrictive composition having the major component as indicated above. However, the addition of a glass material should be avoided, since the glass is likely to react with the above-indicated piezoelectric/electrostrictive material, making it difficult to establish a desired composition of the piezoelectric/electrostrictive layer, thereby causing undesirable deterioration of the operating characteristics of the actuator obtained.

Among the piezoelectric/electrostrictive materials indicated above, it is recommended to use the material which contains lead magnesium niobate, lead zirconate and lead titanate as major components, or lead nickel niobate, lead magnesium niobate, lead zirconate and lead titanate as major components. Particularly preferably used is the material including the lead magnesium niobate, lead zirconate and lead titanate as major components, since this material is not likely to react with the substrate material during heat-treatment thereof, and is therefore free from segregation of its components, whereby a desired composition or crystal structure can be easily achieved by a suitable treatment for maintaining the composition. This material is also advantageous in its relatively high piezoelectric constant. While multicomponent piezoelectric/electrostrictive materials have piezoelectric characteristics which vary depending upon the composition of the components, the above-indicated three-component material composed of lead magnesium niobate, lead zirconate and lead titanate preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly desirable to employ the composition containing 15-50 mole % of lead magnesium niobate, 10-45 mole % of lead zirconate and 30-45 mole % of lead titanate.

The piezoelectric/electrostrictive layer 16 made of the above-described material is formed by any one of the various known film-forming methods as employed for forming the lower electrode 14 and auxiliary electrode 22. Thick-film forming techniques such as screen printing, spraying, dipping and coating are particularly preferably employed, which permit a paste or slurry including a piezoelectric/electrostrictive ceramic powder as a major component, to be formed on the ceramic substrate 12, assuring improved characteristics of the actuator obtained. The piezoelectric/electrostrictive layer 16 may be suitably patterned by screen printing or photolithography, or by laser cutting, slicing, ultrasonic machining or other mechanical machining method which is effected for removing unnecessary portions of a pre-patterned piezoelectric/electrostrictive film.

To assure a relatively large amount of displacement by application of a relatively low voltage, the thickness of the piezoelectric/electrostrictive layer 16 is preferably not larger than 50 $\mu$m, more preferably within a range of 3 to 40 $\mu$m.

The thus formed piezoelectric/electrostrictive layer 16 is heat-treated as needed to be thereby integrated with the lower electrode 14 and auxiliary electrode 22. This heat-treatment is generally effected at a temperature of about 900°-1400° C., preferably within a range between 1000° C. and 1400° C. To avoid a change in the composition of the piezoelectric/electrostrictive material during the heat-treatment of the piezoelectric/electrostrictive layer 16, it is desirable to control the heat-treatment atmosphere, by heating with the evaporation source of the piezoelectric/electrostrictive material. It is also recommended to employ a method of firing the piezoelectric/electrostrictive layer 16 while it is covered with a suitable covering member so that the surface of the layer 16 is not directly exposed to the firing atmosphere. In this case, the covering member is desirably formed of a material similar to that of the ceramic substrate.

On this piezoelectric/electrostrictive layer 16, the upper electrode 18 in the form of a film is formed so as to extend between the piezoelectric/electrostrictive layer 16 and the auxiliary electrode 22 and between the layer 16 and the ceramic substrate 12.

The upper electrode 18 is made of an electrically conductive material which permits good adhesion or sufficiently high strength of bonding of the electrode 18 to the piezoelectric/electrostrictive layer 16, preferably, of the material similar to that of the lower electrode 14 and auxiliary electrode 22. The upper electrode 18 is formed by any one of the above-indicated film-forming methods as employed for forming the lower electrode 14 and auxiliary electrode 22. In this regard, the material for the upper electrode 18 needs to be selected so that the electrode 18 does not substantially react with the material of the piezoelectric/electrostrictive layer 16 so as not to significantly deteriorate the characteristics of the layer 16.

While the thickness of the upper electrode 18 is suitably determined depending upon the specific application of the actuator, the upper electrode 18 is generally formed in thickness of not larger than 20 $\mu$m, preferably not larger than 2 $\mu$m, and more preferably not larger than 1 $\mu$m.

The upper electrode 18 thus formed is then heat-treated as needed to be integrally joined to the piezoelectric/electrostrictive layer 16 and auxiliary electrode 22. Like the lower electrode 14, the upper electrode 18 is not necessarily heat-treated.

In the piezoelectric/electrostrictive actuator 10 constructed as described above, the auxiliary electrode 22 interposed between the piezoelectric/electrostrictive layer 16 and ceramic substrate 12 is joined with sufficiently high strength to both the piezoelectric layer 16 and substrate 12, whereby the piezoelectric layer 16 is firmly secured to the ceramic substrate 12 through the auxiliary electrode 22, at a portion of the electrode 22 indicated by an arrow "$a$" in FIG. 1B.

When the upper electrode 18 is formed to extend between the piezoelectric/electrostrictive layer 16 and auxiliary electrode 22 which are joined together at the portion "$a$", therefore, a force exerted on the upper electrode 18 at the interface between the layer 16 and auxiliary electrode 22 can be reduced to a minimum, whereby the upper electrode 18 is suitably connected to the auxiliary electrode 22 formed on the ceramic substrate 12.

Accordingly, the piezoelectric/electrostrictive actuator 10 is free from disconnection of the upper electrode 18 and other problems which may occur during manufacture and use of the actuator 10. Consequently, the lead portion 24 for electrical connection of the upper electrode 18, as well as the lead portion 20 for the lower electrode 14, can be advantageously formed on the ceramic substrate 12.

Without suffering from the disconnection of the upper electrode 18, for example, the present piezoelectric/electrostrictive actuator 10 yields significantly improved operating reliability and durability.

Figure 2:
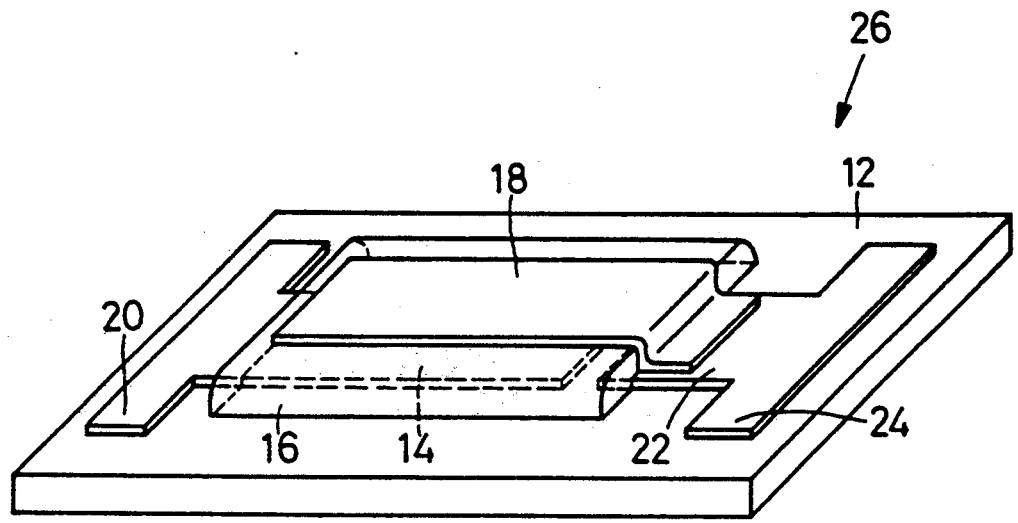
FIG. 2 is a perspective view showing another embodiment of the piezoelectric/electrostrictive element of the invention.
Figure 3:
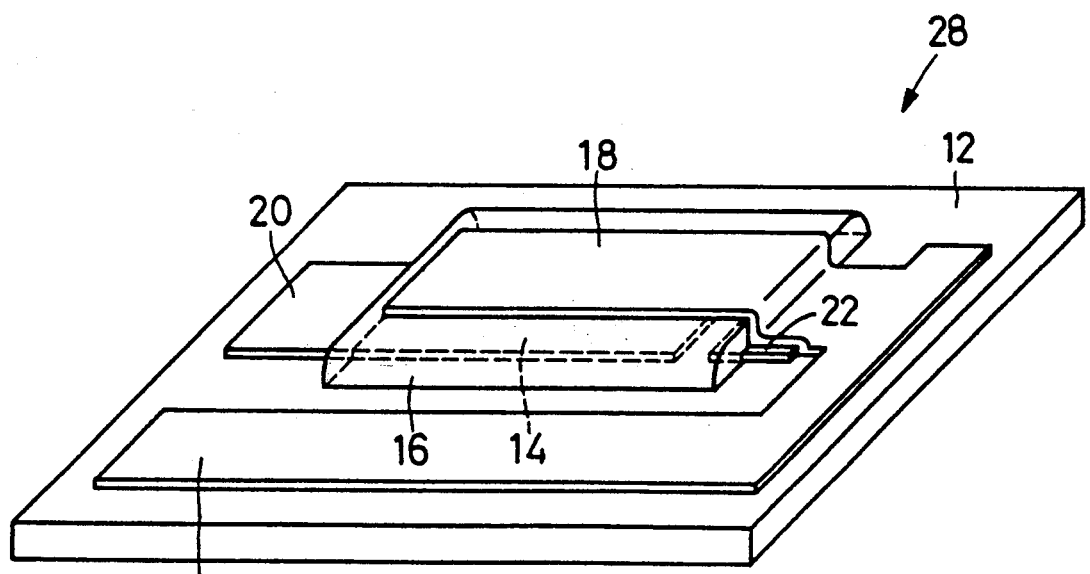
FIG. 3 is a perspective view showing a further embodiment of the piezoelectric/electrostrictive element of the invention.
Figure 4A:
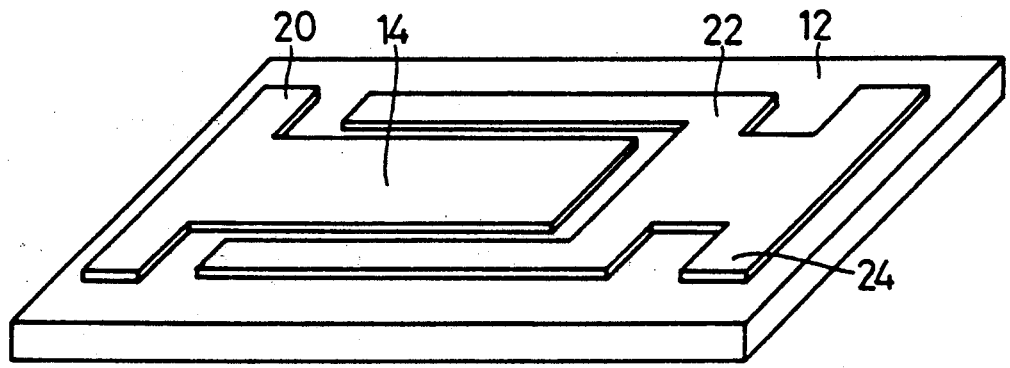
FIGS. 4A-4C are perspective views showing a still further embodiment of the piezoelectric/electrostrictive element of the invention, FIGS. 4A, 4B and 4C respectively corresponding to FIGS. 1A, 1B and 1C.
Figure 4B:
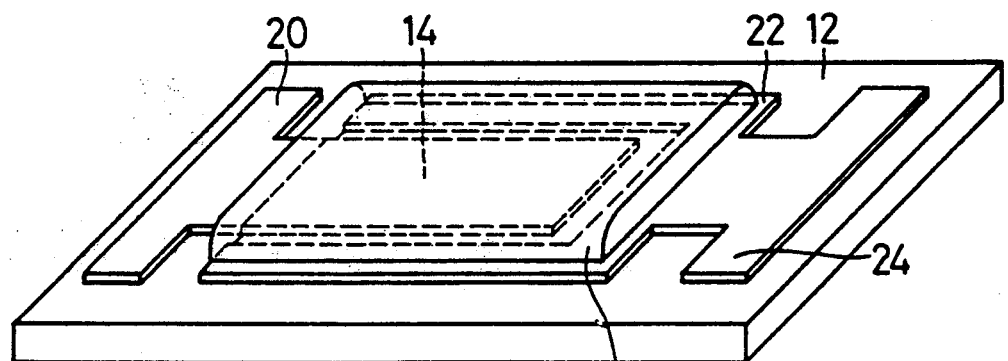
Figure 4C:
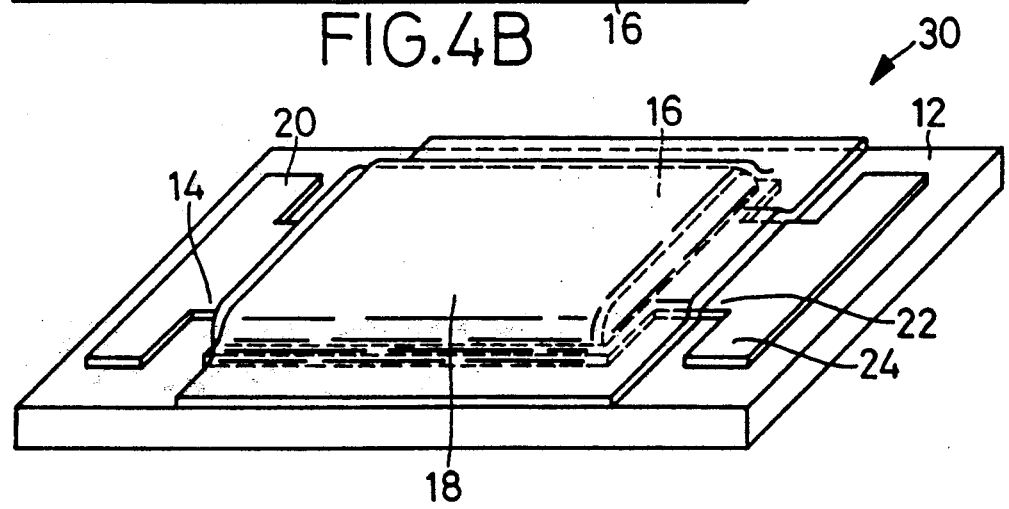

Referring next to FIGS. 2, 3 and 4, there will be described other preferred embodiments of the piezoelectric/electrostrictive element of the invention. In these figures, the same reference numerals as used in the description of the first embodiment are used to identify structurally or functionally identical components or elements, and no detail description of the same will be provided.

In a piezoelectric/electrostrictive element 26 as shown in FIG. 2, the upper electrode 18 takes the form of a strip having a slightly smaller width than the auxiliary electrode 22. It will be understood from this embodiment that the upper electrode 18 is not necessarily jointed to the ceramic substrate 12.

In a piezoelectric/electrostrictive element 18 as shown in FIG. 3, the upper electrode 18 is formed so as to extend between the piezoelectric/electrostrictive layer 16 and the auxiliary electrode 22 and between the electrode 22 and the ceramic substrate 12. The upper electrode 18 is formed integrally with the lead portion 24. With the auxiliary electrode 22 joined to the piezoelectric/electrostrictive layer 16 and the ceramic substrate 12, the upper electrode 18 can be formed to reach onto the ceramic substrate 12 via the auxiliary electrode 22, as in the instant embodiment.

In a piezoelectric/electrostrictive element 30 as shown in FIG. 4, the auxiliary electrode 22 includes a U-shaped portion which surrounds the lower electrode 14, as viewed in the direction perpendicular to the plane of the substrate 12. The use of the thus shaped auxiliary electrode 22 leads to a significantly increased area of joining contact between the upper electrode 18 and the auxiliary electrode 22.

Figure 5:
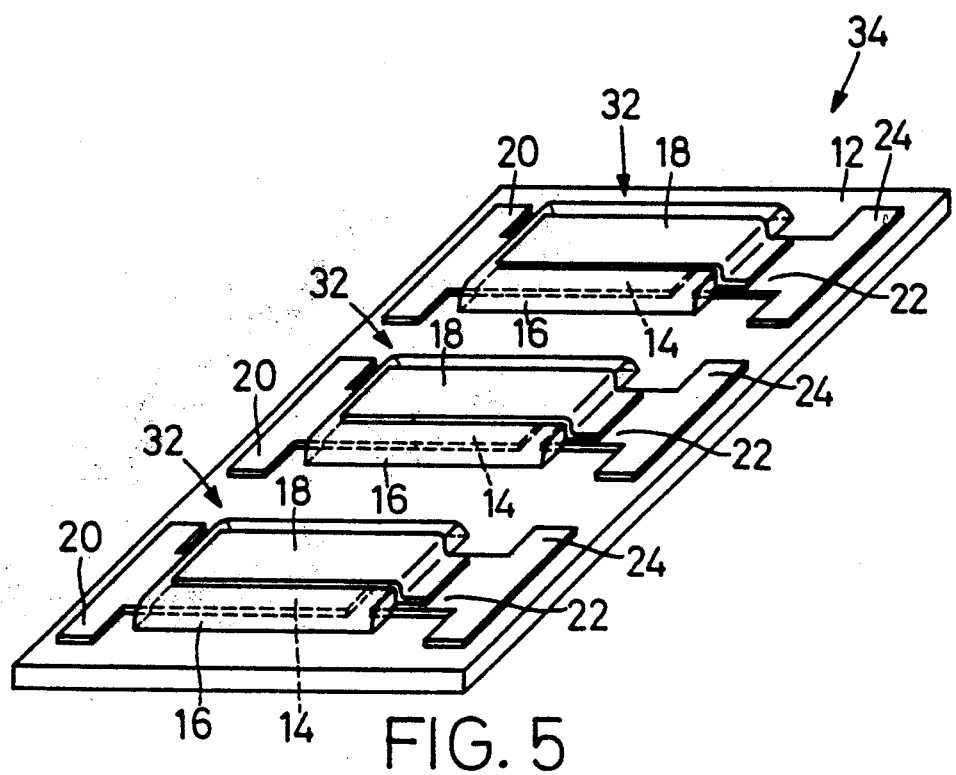
FIG. 5 is a perspective view showing a still another embodiment of the piezoelectric/electrostrictive element of the invention.
Figure 6:
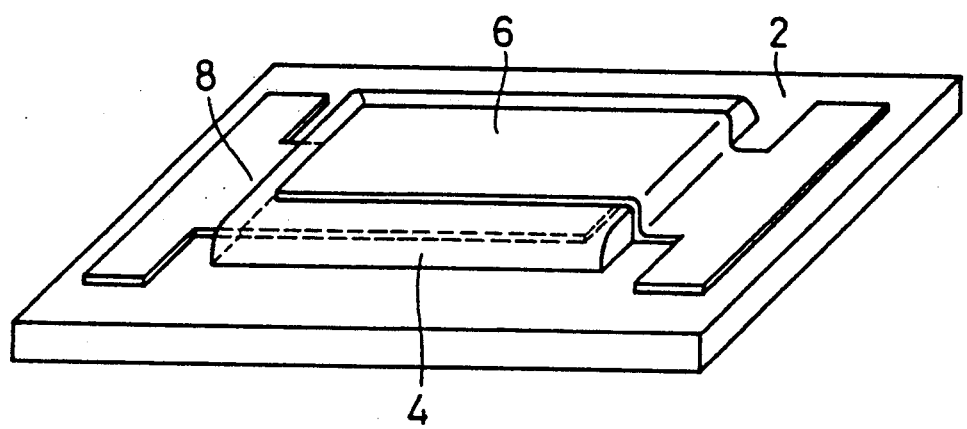
FIG. 6 is a perspective view showing one example of a piezoelectric/electrostrictive element proposed by the present inventors, in which upper and lower electrodes have electrical leads formed on a ceramic substrate.

Referring next to FIG. 5, a plurality of lower electrodes 14 are formed on the ceramic substrate 12, such that the electrodes 14 are equally spaced from each other in the longitudinal direction of the substrate 12. With respect to each of the lower electrodes 14, the auxiliary electrode 22, piezoelectric/electrostrictive layer 16 and upper electrode 18 are formed in lamination to provide an integral laminar structure. Thus, a plurality of piezoelectric/electrostrictive units 32 each having the same construction as the element 26 shown in FIG. 2 are formed in parallel with each other, so as to constitute a piezoelectric/electrostrictive element 34 as shown in FIG. 5. Since each piezoelectric/electrostrictive unit 32 is formed by an ordinary film-forming method, two or more units 32 can be easily formed in parallel on the ceramic substrate 12, whereby the piezoelectric/electrostrictive element 34 having excellent characteristics can be easily manufactured at a reduced cost.

While the present invention has been described in its presently preferred embodiments with a certain degree of particularity, it is to be understood that the invention is not limited to the details of the illustrated embodiments, but may be otherwise embodied.

For example, a coating material such as resin may be provided between the ceramic substrate 12 and the piezoelectric/electrostrictive layer 16, at a portion where the auxiliary electrode 22 is not interposed.

Further, the piezoelectric/electrostrictive units each including a piezoelectric/electrostrictive layer and electrodes may be formed on the opposite major surfaces of the ceramic substrate 12.

While the ceramic substrate 12 in the form of a thin flat plate is used in the illustrated embodiments, the substrate may consist of a thick-walled peripheral portion, and a thin-walled central portion on which a piezoelectric/electrostrictive unit or units is/are formed.

It is also to be understood that the present invention may be embodied with various other changes, modifications and improvements, which may occur to those skilled in the art, without departing from the spirit and scope of the invention defined in the following claims.

What is claimed is:

1. A piezoelectric/electrostrictive element comprising:
    a ceramic substrate formed principally of zirconia having a crystal phase which is partially or fully stabilized;
    a lower electrode formed on said ceramic substrate;
    a piezoelectric/electrostrictive layer formed on said lower electrode, said piezoelectric/electrostrictive layer being formed of a piezoelectric/electrostrictive material having a perovskite structure or a composite perovskite structure which contains lead element;
    an upper electrode formed on said piezoelectric/electrostrictive layer, said lower electrode and said piezoelectric/electrostrictive layer cooperating with the upper electrode to form a laminar structure; and
    an auxiliary electrode formed on said ceramic substrate, apart from said lower electrode, such that a portion of said auxiliary electrode is located between said piezoelectric/electrostrictive layer and the ceramic substrate, said auxiliary electrode being formed of an electrically conductive material which permits sufficient adhesion of the auxiliary electrode to the ceramic substrate and the piezoelectric/electrostrictive layer, said upper electrode extending between and electrically connected to the auxiliary electrode and the piezoelectric/electrostrictive layer.

2. A piezoelectric/electrostrictive element of claim 1, wherein said piezoelectric/electrostrictive material contains lead magnesium niobate, lead zirconate and lead titanate as major components.

3. A piezoelectric/electrostrictive element of claim 1, wherein said electrically conductive material of said auxiliary electrode is a cermet of platinum and at least one of a material for said ceramic substrate and a material for said piezoelectric/electrostrictive layer.

4. A piezoelectric/electrostrictive element of claim 1, wherein the zirconia of said ceramic substrate is partially or fully stabilized by at least one compound selected from the group consisting of: yttrium oxide; ytterbium oxide; cerium oxide; calcium oxide; and magnesium oxide.

5. A piezoelectric/electrostrictive element of claim 4, wherein the zirconia is stabilized by yttrium oxide.

6. A piezoelectric/electrostrictive element of claim 1, wherein said lower electrode and said auxiliary electrode have respective lead portions which are formed on said ceramic substrate.

7. A piezoelectric/electrostrictive element of claim 1, wherein said upper electrode reaches onto said ceramic substrate via said auxiliary electrode.

8. A piezoelectric/electrostrictive element of claim 7, wherein said lower electrode and said upper electrode have respective lead portions which are formed on said ceramic substrate.

9. A piezoelectric/electrostrictive element of claim 1, wherein said auxiliary electrode includes a U-shaped portion which surrounds said lower electrode, as viewed in a direction perpendicular to a plane of said ceramic substrate.

10. A piezoelectric/electrostrictive element of claim 1, wherein each of said lower electrode, said upper electrode and said auxiliary electrode is in the form of a film having a thickness of not larger than 20 $\mu$m.

* * * * *